United States Patent [19]

Gätzschmann et al.

[11] 4,448,836

[45] May 15, 1984

[54] METHOD FOR PRETREATING THERMOPLASTIC SUBSTRATES CONTAINING CARBONAMIDE GROUPS IN THE PREPARATION OF STRONGLY ADHERING METAL COATINGS

[75] Inventors: Horst Gätzschmann, Schermbeck; Herbert Bertels, Marl; Hubertus Häfner, Marl; Alfred Schmid, Marl, all of Fed. Rep. of Germany

[73] Assignee: Chemische Werke Hüls AG, Marl, Fed. Rep. of Germany

[21] Appl. No.: 524,359

[22] Filed: Aug. 18, 1983

[30] Foreign Application Priority Data

Sep. 16, 1982 [DE] Fed. Rep. of Germany ....... 3234363

[51] Int. Cl.$^3$ .......................... B32B 3/00; C25D 5/00; B05D 3/04; B29C 17/08
[52] U.S. Cl. .................................. 428/164; 156/651; 156/668; 204/30; 204/38 B; 427/307; 428/323
[58] Field of Search ............... 204/30, 32, 37 R, 38 R, 204/38 B, 40; 156/651, 668, 150; 427/307, 305, 316, 322; 428/164, 170, 171, 323, 327

[56] References Cited

U.S. PATENT DOCUMENTS 3,627,576 12/1971 Knorre et al. .................. 156/668 X
3,702,285 11/1972 Knorre et al. ....................... 204/30

*Primary Examiner*—William A. Powell
*Attorney, Agent, or Firm*—Wells & Wells

[57] ABSTRACT

The pretreating of thermoplastic substrates containing carbonamide groups and an inorganic, fine-particulate adhesion filler, is improved to produce strongly adhering metal coatings thereon, by combining the following steps: the pickling is divided in at least two partial steps, where the first partial step comprises predipping in a pickling solution such as 50 to 96% sulfuric acid where the surface tension is lowered to at most 25 mN/m at 20° C., and the pretreated plastic is dried at 70° to 110° C. before the actual galvanic metal deposition.

11 Claims, No Drawings

METHOD FOR PRETREATING THERMOPLASTIC SUBSTRATES CONTAINING CARBONAMIDE GROUPS IN THE PREPARATION OF STRONGLY ADHERING METAL COATINGS

CROSS-REFERENCE TO A RELATED APPLICATION

Applicants claim priority under 35 USC 119 for application No. P 32 34 363.9, filed Sept. 16, 1982, in West Germany.

BACKGROUND OF THE INVENTION

The field of the invention is the pretreatment of plastic substrates prior to electrocoating.

The invention is particularly concerned with a method of pretreating plastics containing carbonamide groups and fine particulate, inorganic adhesive fillers. The plastics have at least 10 aliphatically bound carbon atoms for each carbonamide group, for example polyundecanamide (10 carbon atoms per carbonamide group) or especially polylauryllactam (11 carbon atoms per carbonamide group). Metal coatings are strongly adhered to these polyamide substrates.

The state of the art of preparing the polyamide substrate materials may be ascertained by reference to British Pat. No. 1,201,937; West German Pat. No. 2,216,330; and the "Kirk-Othmer Encyclopedia of Chemical Technology", 2nd Edition, Vol. 16 (1968), under the section "Polyamide (Plastics)", pages 88–105, particularly page 92—polylauryllactam (polyamide-12) and polyundecanamide (polyamide-11), and pages 92–95, "Additives", the disclosures of which are incorporated herein. Pretreatment of the substrate and electroplating thereon may be ascertained by reference to U.S. Pat. No. 4,298,424, and "Kirk-Othmer", 3rd Edition, Vol. 8 (1979), pages 826–869, particularly pages 832–833, the disclosures of which are incorporated herein.

It is known how to electrochemically coat thermoplastic substrates with metals. Especially practical thermoplastics in this respect have been found to be the ABC copolymers (acrylonitrile-butadiene-styrene copolymers) as disclosed in "Kirk-Othmer" i.b.i.d., Vol. (8), page 832, or polyolefins, in particular polypropylene. Due to their polar character and their water absorption, special treatment is required for polyamide substrates. Accordingly, the prior art methods have not yet been satisfactory.

It is known that prior to the actual galvanic metal deposition, the plastic substrate must be pretreated in order to provide adhesion sites for the metal. This procedure is carried out in corresponding baths with intermediate rinsing treatments. As a rule the following procedure takes place: following cleaning and degreasing, numerous microcavities are produced on the surface of the molded substrate to be coated, most of the time in an acid bath, i.e., by pickling or roughing. The step herein described as pickling is recommended to be carried out in parts. In a first bath the surface is soaked, this operation being designated as predipping, and in a second bath there takes place the roughening proper, namely the pickling. This is followed by activation, for instance by the deposition of silver or palladium seeds which then make possible the deposition of an electrically conducting coating, for instance by reduction deposition of copper or nickel. This is followed by the galvanic deposition of metals. As already mentioned, rinsing takes place in conventional manner between these individual operations.

It is furthermore known to be advantageous to admix inorganic, fine particulate fillers, hereinafter designated as adhesion fillers in distinction to the other fillers, to the plastic. These adhesion fillers on the one hand result in a rougher surface which are reproduced in the metal coating and, on the other hand, provided they are susceptible to acids, they form additional microcavities during the pretreatment and intermediate treatment as disclosed in British Pat. No. 1,201,937. Lastly, it is also known to admix a plastic concentrate with the plastic before it is metallized, where this concentrate contains an inorganic fine powder at least partly soluble in sulfuric acid and containing coal tar asphalt besides the plastic as disclosed in West German Pat. No. 2,216,330. Aside from the fact that it is inadmissable to add the carcinogenic coal tar asphalt to the concentrate, the addition of these hydrocarbon polymers such as polypropylene furthermore generates incompatibilities in the mixture and hence results in appreciable, internal stresses and therefore a reduced adhesion of the metal coating deposited on the plastic substrate. Even though West German Pat. No. 2,216,330 also recommends adding to polyamide-12, applicants could not obtain adhesive metal coatings when reproducing the results of West German Pat. No. 2,216,330.

SUMMARY OF THE INVENTION

Having in mind the limitations of the prior art it is an object of the present invention to pretreat carbonamide bearing thermoplastic substrates having at least 10 carbon atoms per carbonamide group so that well adhering metal coatings are applied thereto.

The pretreatment is carried out by pickling in at least two separate partial steps separated by a rinsing procedure. The first partial step, namely pre-dipping, is performed in 50 to 96% sulfuric acid where the surface tension is at most 25 mN/m at 20° C., and where the pretreated plastic is dried at temperatures from 70° C. to the limit of thermal dimensional stability. The drying takes place following the activation or following the deposition of the electrically conducting layer prior to the galvanic metal deposition. Wetting agents are used to maintain the surface tension at 25 mN/m or less.

DESCRIPTION OF THE PREFERRED EMBODIMENTS

Suitable thermoplastics containing carbonamide groups (molding materials for the substrates) are for instance homopolyamides such as polyundecanamide, in particular polyamide-12 (polylauryllactam). Injection molding and extrusion type polyamides are suitable, in particular those having viscosity numbers between 120 and 260 (DIN-German Industrial Standard 53 727), representing a $\eta_{rel}$ value between 1.6 and 2.3. Copolyamides containing the monomer components mentioned above in predominant amounts and also polyesteramides based on these polyamide components are less desirable.

The plastic substrate to be coated is appropriately processed as a molding material into the molded article to be coated already containing an adhesion filler. Preferred adhesion fillers are pulverulent zeolites or pulverulent calcium carbonate.

The molding material is prepared in suitable manner by remelting the plastic granulate or powder together with the filler powder in a screw kneader. It is equally feasible to dose the adhesion filler into the plastic melt and to granulate the melt thereafter. If required, the plastics may also contain stabilizers, lubricants, mold-injection means, plasticizers, dyestuffs and other fillers which are not adhesion fillers, such as titanium dioxide, talc, wollastonite, quartz flour, calcined kaolin, mica, glass fibers having particle sizes of at most 10 microns, when present in the conventional amounts.

The adhesion filler is added in proportions of 1 to 45 parts by weight referred to the plastic, preferably 2 to 20, especially 3 to 10 parts by weight. The particle size of the adhesion filler is between 0.05 and 5 microns, being between 1 and 5 microns for the zeolites and between 0.05 and 1 micron for calcium carbonate. Preferably fine particulate powders having a particle size between 0.05 and 1 micron are used, and calcium carbonate is especially advantageous.

The total proportion of filler and adhesion filler amounts to 1 to 100 parts by weight referred to the plastic. Preferably this total proportion shall be from 2 to 75, in particular 3 to 65 parts by weight. In other words, the proportion of the adhesion filler is 2 to 100, preferably 4 to 100, especially 6 to 100 parts by weight. The filler additives are practically insoluble in sulfuric acid. Accordingly, the use of relatively low amounts of the adhesion filler in combination with other fillers makes possible an improvement in adhesion for the galvanically deposited metal coating.

Because of the water-retention capability, in particular in the presence of zeolites, controlled plastics are advantageously used in polymerization, which post condense to the desired degree of polymerization by drying during shaping. The degree of polymerization of such plastics is expressed by the $\eta_{rel}$ value in the range from 1.50 to 2.00, preferably between 1.6 and 1.9, in particular between 1.7 and 1.8.

Preferably, the predipping bath is 50 to 96%, advantageously 60 to 70%, sulfuric acid which may contain such additives as wetting agents, for instance potassium prefluoroalkyl sulfonate. It is essential for the implementation of the present invention that the surface tension of the predipping solution be lowered to at least 25 mN/m (at 20° C.), in other words, the wetting agent concentrations employed must be higher than those used in the state of the art. Advantageously the surface tension is 16 to 25, especially 19 to 22 mN/m at 20° C. Other useful wetting agents include generally "Fluortenside", that are wetting agents containing fluor compounds which are stable against sulfuric acid and reduce its surface tension. Such wetting agents are known by the trade name, i.e. "DEWEKA-Germaplat" (Dr. Kampschulte, Solingen, Fed. Rep. Germany), "Cr-flüssig" (Schering AG, Berlin, Fed. Rep. Germany). "HSO-Netzmittel für Chrombäder" (Herbert Schmidt GmbH & Co. KG, Solingen, Fed. Rep. Germany).

Lastly, another step essential to the invention is the intermediate drying prior to metal coating. The intermediate drying is carried out appropriately following the chemical metal deposition; however, drying may also be carried out after the activation. This has been found necessary for all plastics used, and is not done because of the aforementioned post condensation.

The intermediate drying takes place at temperatures from 70° C. to the limit of dimensional stability, in particular 90° to 110° C. The time of drying depends inherently on the temperature and as a rule will be roughly 30 minutes for 90° C. and 10 minutes for 110° C.

The coated molded substrates are tested by the adhesion test of DIN German Industrial Standard 53 494, wherein the force required to detach a 25 mm wide film of metal from the plastic is measured. As regards the thermally loaded parts, temperature cycling tests per DIN German Industrial Standard 53 496 are performed.

EXAMPLE 1

A molded substrate consisting of 100 pars of polyamide-12 with a $\eta_{rel}$ of 1.9 and 5 parts by weight of a zeolite powder with an average particle size of 2 microns or 5 parts by weight of calcium carbonate with an average particle size of 0.07 microns, is first predipped at room temperature for 2 to 5 minutes in 60% sulfuric acid where the surface tension was lowered to 19 to 22 mN/m by the addition of 0.1 g/l of a wetting agent containing potassium perfluoralkyl sulfonate and known by the trade name FC-95 (3 M Deutschland GmbH), then it is rinsed for 0.5 to 2 minutes in flowing, fully desalted water and next it is roughened from 0.5 to 3 minutes in a pickling solution of chromosulfuric acid at room temperature. After the samples were rinsed at room temperature for 0.5 to 3 minutes in fully desalted water and were reduced for 2 to 10 minutes at room temperature in an approximately 25% solution of hydrochloric acid, the molded substrate is first rinsed for 5 to 20 minutes in water at 40° to 90° C. and then rinsed at room temperature for 0.5 to 2 minutes in fully desalted water, whereupon it is seeded with a conventional activator system (Sn/Pd or Sn/Ag). From 0.2 to 0.5 micron copper is deposited on the samples so prepared in a chemically functioning copper bath. Following drying at 90° to 110° C. from 10 to 30 minutes in a circulating air drying-chamber, the samples are electrolytically reinforced and coated galvanically with copper.

Results: The adhesion of the deposited copper coating according to DIN 53 494 is as high as 80 N/25 mm, with an average of 60 N/25 mm. The samples withstood the temperature cycling test per DIN German Industrial Standard 53 496, load classification A.

EXAMPLE 2

Equally good results are obtained when a molded substrate consisting of 100 parts by weight of polyamide-12 ($\eta_{rel}$ 1.9), 45 parts by weight of mica (ggM 300), 4 parts by weight of calcium carbonate (0.07 micron average), 1 part by weight of a phenolic antioxidant and 0.3 parts by weight of calcium stearate is used (Peeling test per DIN German Industrial Standard 53 494=70 N/25 mm).

CONTROL TEST 1

When the molded substrate of Example 1 is predipped in the same manner into 60% sulfuric acid where the surface tension, however, is lowered to only 26 mN/mm by the addition of 0.05 g/l of said FC-95 wetting agent, and when this substrate is further treated as described in Example 1, then an incomplete copper coating is obtained.

CONTROL TEST 2

When the molded substrate according to Example 1 is treated in the same manner as in Example 1 but without intermediate drying, then the copper coating detaches from the surface (so-called blistering).

CONTROL TEST 3

When, in lieu of polyamide-12, 100 parts by weight of polyamide-6 or 100 parts of polyamide-6,6 are treated as described in Example 1 with 5 parts by weight of zeolite or 5 parts by weight of calcium carbonate, respectively, then the surfaces, despite short durations of predipping or pickling, will be corroded, so that no adequate coating can be achieved.

Table 1 below lists further results from the Examples of the present invention (E1 through E5) and control tests (V1 through V4).

TABLE 1

| | Polyamide (PA) (DIN 53 727) $\eta$rel | Adhesion Filler Particle Size 0 μm | Proportion parts by weight/ 100 parts of PA | Filler | Proportion parts by weight/ 100 parts of PA | Predipping surface tension mN/m$^{-1}$ | Drying Temp. °C. | Drying Time min. | Metal* Peeling Test DIN 53 494 N/25 mm | Temperature cycling test DIN 53 496 +80° C./ −50° C. | Remarks |
|---|---|---|---|---|---|---|---|---|---|---|---|
| V 1 | PA-12 1.8 | Zeolite 2 | 5 | — | — | >25 | 70 | 60 | — | — | Already partial separation of the reduced, deposited coating |
| V 2 | PA-12 1.8 | — | — | — | — | 19–22 | 120 | 30 | No adhesion | — | |
| V 3 | PA-12 1.8 | Zeolite 2 | 5 | — | — | 19–22 | — | — | No adhesion | — | |
| V 4 | PA-12 1.8 | — | — | Kaoline | 30 | 19–22 | 90 | 30 | No adhesion | — | |
| E 1 | PA-12 1.8 | Zeolite 2 | 4.8 | — | — | 19–22 | 90 | 30 | 55 | + | Good Surface |
| E 2 | PA-12 1.8 | Zeolite 2 | 7.2 | — | — | 19–22 | 90 | 30 | 55 | + | Good Surface |
| E 3 | PA-12 1.7 | Zeolite 2 | 4.8 | — | — | 19–22 | 90 | 30 | 55 | + | Good Surface |
| E 4 | PA-12 1.8 | Calcium Carbonate 0.07 | 4.8 | — | — | 19–22 | 90 | 30 | 60 | + | Good Surface |
| E 5 | PA-12 1.9 | Calcium carbonate 0.07 | 3.3 | Kaoline | 30 | 19–22 | 90 | 30 | 60 | + | Good Surface |

*5-measurement average

What we claim is:

1. In a process for pretreating thermoplastic substrates, seeding with an activator system, depositing an electrically conductive layer thereon, and galvanically depositing a metal coating thereon, wherein said thermoplastic substrates are polymers containing carbonamide groups and an inorganic fine particulate adhesion filler, said polymer having at least 10 aliphatically bound carbon atoms per carbonamide group, the improvement comprising:
   carrying out said pretreating by pickling in at least first and second separate partial steps separated by a rinsing procedure, where said first partial step, namely predipping, is performed in 50 to 96% sulfuric acid having a surface tension not more than about 25 mN/m at 20° C., and drying said pretreated thermoplastic substrate at temperatures from 70° C. to the limit of thermal dimensional stability, said drying step being carried out after said seeding or said depositing and prior to said galvanically depositing metal.

2. The process of claim 1, wherein said surface tension is maintained by the addition of wetting agents.

3. The process of claim 2, wherein said inorganic fine particulate adhesion filler has a particle size of about 0.05 and 5 microns in a concentration of about 1 to 45% by weight based on the weight of said thermoplastic substrate.

4. The process of claim 3, wherein said concentration is about 2 to 20% by weight.

5. The process of claim 3, wherein said concentration is about 3 to 10% by weight.

6. The process of claim 3, wherein said filler is a zeolite having a particle size between about 1 and 5 microns.

7. The process of claim 3, wherein said filler is calcium carbonate having a particle size between 0.05 and 1 micron.

8. The process of claim 1, wherein said drying is carried out at temperatures between about 70° C. and 100° C.

9. The process of claim 1, wherein said thermoplastic substrate is polyundecanamide.

10. The process of claim 1, wherein said thermoplastic substrate is polylauryllactam.

11. The metal coated article obtained by the process of claim 1.

* * * * *